(12) United States Patent
Shirao

(10) Patent No.: US 10,861,758 B2
(45) Date of Patent: Dec. 8, 2020

(54) SEMICONDUCTOR DEVICE, POWER CONVERSION APPARATUS, AND METHOD OF MANUFACTURING SEMICONDUCTOR DEVICE

(71) Applicant: Mitsubishi Electric Corporation, Tokyo (JP)

(72) Inventor: Akitoshi Shirao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/447,569

(22) Filed: Jun. 20, 2019

(65) Prior Publication Data
US 2020/0043818 A1 Feb. 6, 2020

(30) Foreign Application Priority Data
Jul. 31, 2018 (JP) .................. 2018-143468

(51) Int. Cl.
| | |
|---|---|
| *H01L 23/28* | (2006.01) |
| *H01L 23/16* | (2006.01) |
| *H01L 21/56* | (2006.01) |
| *H02M 7/5387* | (2007.01) |
| *H01L 21/54* | (2006.01) |
| *H01L 23/31* | (2006.01) |
| *H01L 21/52* | (2006.01) |

(52) U.S. Cl.
CPC .............. *H01L 23/16* (2013.01); *H01L 21/52* (2013.01); *H01L 21/54* (2013.01); *H01L 21/565* (2013.01); *H01L 23/3107* (2013.01); *H02M 7/53871* (2013.01)

(58) Field of Classification Search
CPC . H01L 2224/48091; H01L 2924/00014; H01L 21/52; H01L 21/54; H01L 21/565; H01L 2224/49111; H01L 2224/73265; H01L 23/04; H01L 23/053; H01L 23/16; H01L 23/24; H01L 23/3107; H01L 2924/19107; H02M 7/003; H02M 7/53871
See application file for complete search history.

(56) References Cited

FOREIGN PATENT DOCUMENTS

| | | |
|---|---|---|
| JP | H09-252062 A | 9/1997 |
| JP | 2009-147030 A | 7/2009 |
| JP | 2010-098097 A | 4/2010 |

*Primary Examiner* — Robert G Bachner
(74) *Attorney, Agent, or Firm* — Studebaker & Brackett PC

(57) ABSTRACT

A semiconductor device includes a case surrounding a region that contains semiconductor elements and wires. The case is provided with s(an integer greater than k and equal to or greater than three)-pieces of discharge paths for discharging an encapsulation member to the region. The s-pieces of discharge paths are provided so as to surround the region as seen in a plan view. The s-pieces of discharge paths are spirally provided as seen in a plan view.

11 Claims, 12 Drawing Sheets

F I G. 4
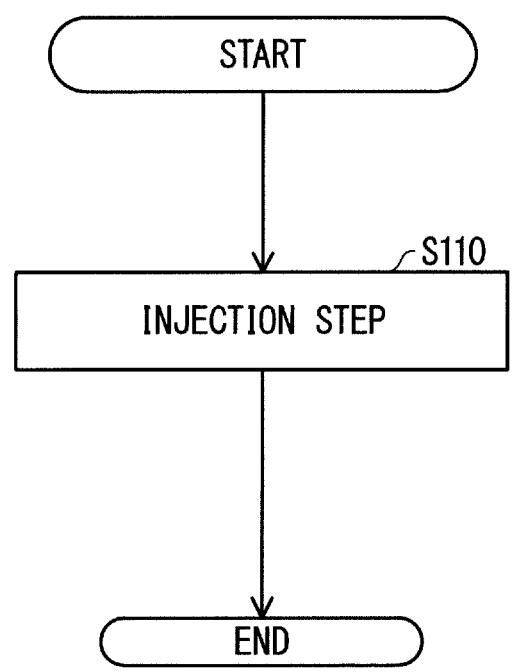

US 10,861,758 B2

SEMICONDUCTOR DEVICE, POWER CONVERSION APPARATUS, AND METHOD OF MANUFACTURING SEMICONDUCTOR DEVICE

BACKGROUND OF THE INVENTION

Field of the Invention

The present invention relates to a semiconductor device having a structure relating to an encapsulation member, a power conversion apparatus, and a method of manufacturing the semiconductor device.

Description of the Background Art

There are devised various techniques of encapsulating, with an encapsulation member, a region that contains semiconductor elements and wires (hereinafter also referred to as the "region Rgs"). Japanese Patent Application Laid-Open No. 2009-147030 (FIG. 3(b)) discloses a structure in which a region Rgs is encapsulated with an encapsulation member using a plurality of through holes provided at a case (hereinafter also referred to as the "related structure A").

Specifically, in the related structure A, two through holes are provided having the region Rgs interposed between them. Each of the two through holes has a discharge path (a flow-in port) for discharging the encapsulation member to the region Rgs. Further, in the related structure A, two discharge paths are provided having the region Rgs interposed between them.

In the related structure A, the two discharge paths of the two through holes disposed having the region Rgs interposed between them are juxtaposed to each other linearly. Therefore, the region Rgs tends to be unevenly filled with the discharged encapsulation member which is discharged to the region Rgs. Accordingly, in the related structure A, in the situation where the region Rgs is filled with the encapsulation member, bubbles (gaps) may generate.

SUMMARY

An object of the present invention is to provide a semiconductor device and the like with suppressed generation of bubbles in the situation where a region containing a semiconductor element and a wire is filled with an encapsulation member.

A semiconductor device according to one aspect of the present invention has a region filled with an encapsulation member. The semiconductor device includes: a substrate; a semiconductor element fixed to the substrate; a wire connected to the semiconductor element; and a case surrounding the region that contains the semiconductor element and the wire. The case is provided with k(an integer equal to or greater than two)-pieces of through holes. Each of the through holes is provided with an injection port for injecting the encapsulation member. The case is provided with s(an integer greater than k and equal to or greater than three)-pieces of discharge paths for discharging the encapsulation member to the region. Each of the through holes has a plurality of discharge paths included in the s-pieces of discharge paths. The s-pieces of discharge paths are provided so as to surround the region as seen in a plan view. The s-pieces of discharge paths are spirally provided as seen in a plan view.

The present invention suppresses generation of bubbles in the situation where the region containing the semiconductor element and the wire is filled with the encapsulation member.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a flowchart of a manufacturing method Pr according to the first preferred embodiment;

DESCRIPTION OF THE PREFERRED EMBODIMENTS

Figure 1:
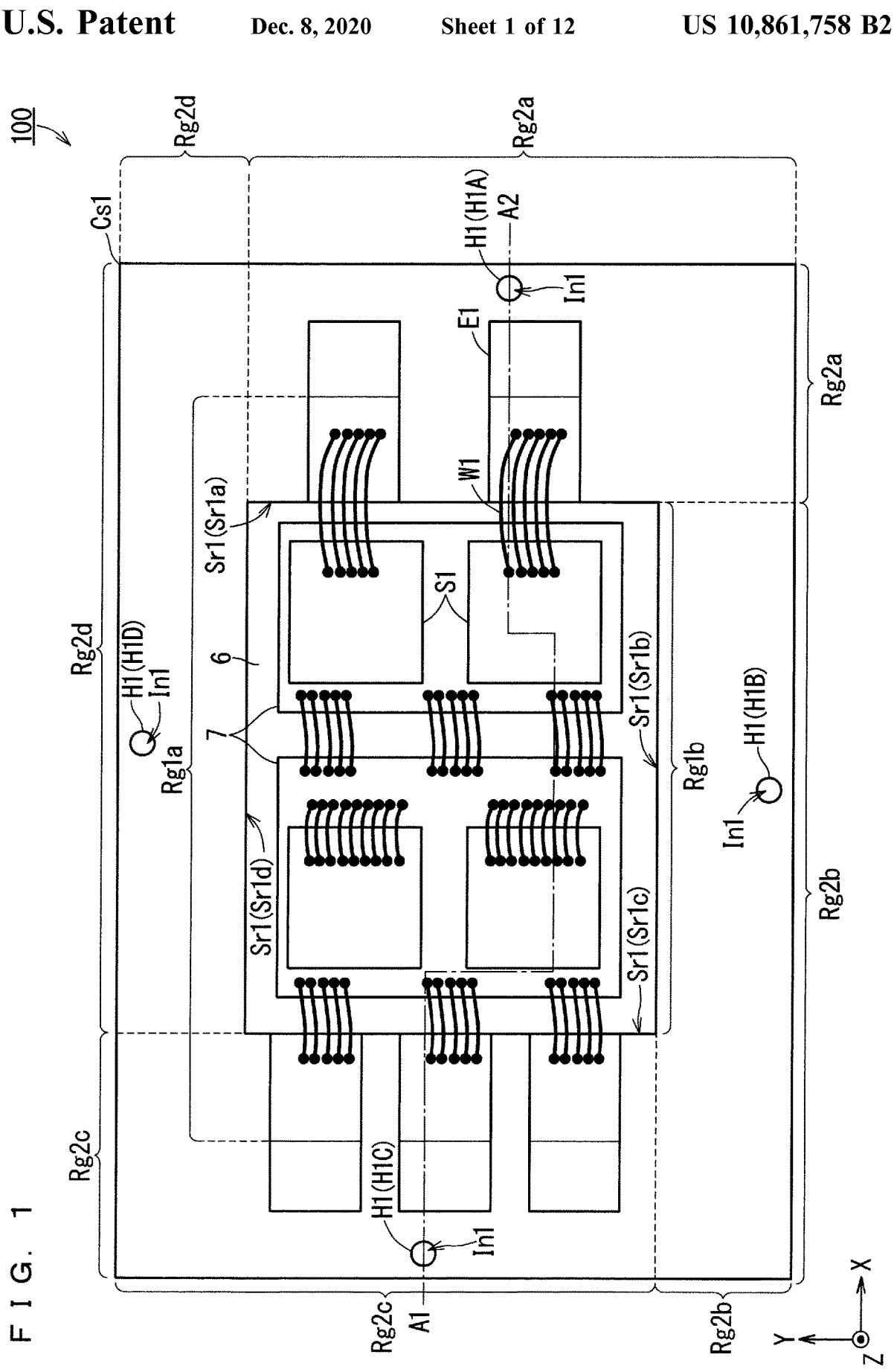
FIG. 1 is a plan view of a semiconductor device according to a first preferred embodiment.

In the following, with reference to the drawings, a description will be given of preferred embodiments of the present invention. In the drawings referred to in the following, an identical constituent component is denoted by an identical reference character. Those constituent components denoted by an identical reference character are the same in name and function. Accordingly, a detailed description may be omitted as to part of such constituent components denoted by an identical reference character.

Note that, the dimension, material, shape of each of the constituent components exemplarily shown in the preferred embodiments and the relative disposition of the constituent components may be changed as appropriate depending on the structure, various conditions and the like of the device to which the present invention is applied. Further, the dimension of each of the constituent components in the drawings may differ from the actual dimension.

First Preferred Embodiment

FIG. 1 is a plan view of a semiconductor device 100 according to a first preferred embodiment. The semiconductor device 100 is, for example, a household, industrial, automotive, or railcar-use power module.

In FIG. 1, an X direction, a Y direction, and a Z direction are perpendicular to each other. In the subsequent drawings also, the X direction, the Y direction, and the Z direction are perpendicular to each other. Hereinafter, a direction including the X direction and a direction opposite to the X direction (−X direction) is also referred to as the "X-axis direction". Further, hereinafter, a direction including the Y direction and a direction opposite to the Y direction (−Y direction) is also referred to as the "Y-axis direction". Still further, hereinafter, a direction including the Z direction and a direction opposite to the Z direction (−Z direction) is also referred to as the "Z-axis direction".

Further, hereinafter, a plane including the X-axis direction and the Y-axis direction is also referred to as the "XY plane". Still further, hereinafter, a plane including the X-axis direction and the Z-axis direction is also referred to as the "XZ plane". Still further, hereinafter, a plane including the Y-axis direction and the Z-axis direction is also referred to as the "YZ plane".

Figure 2:
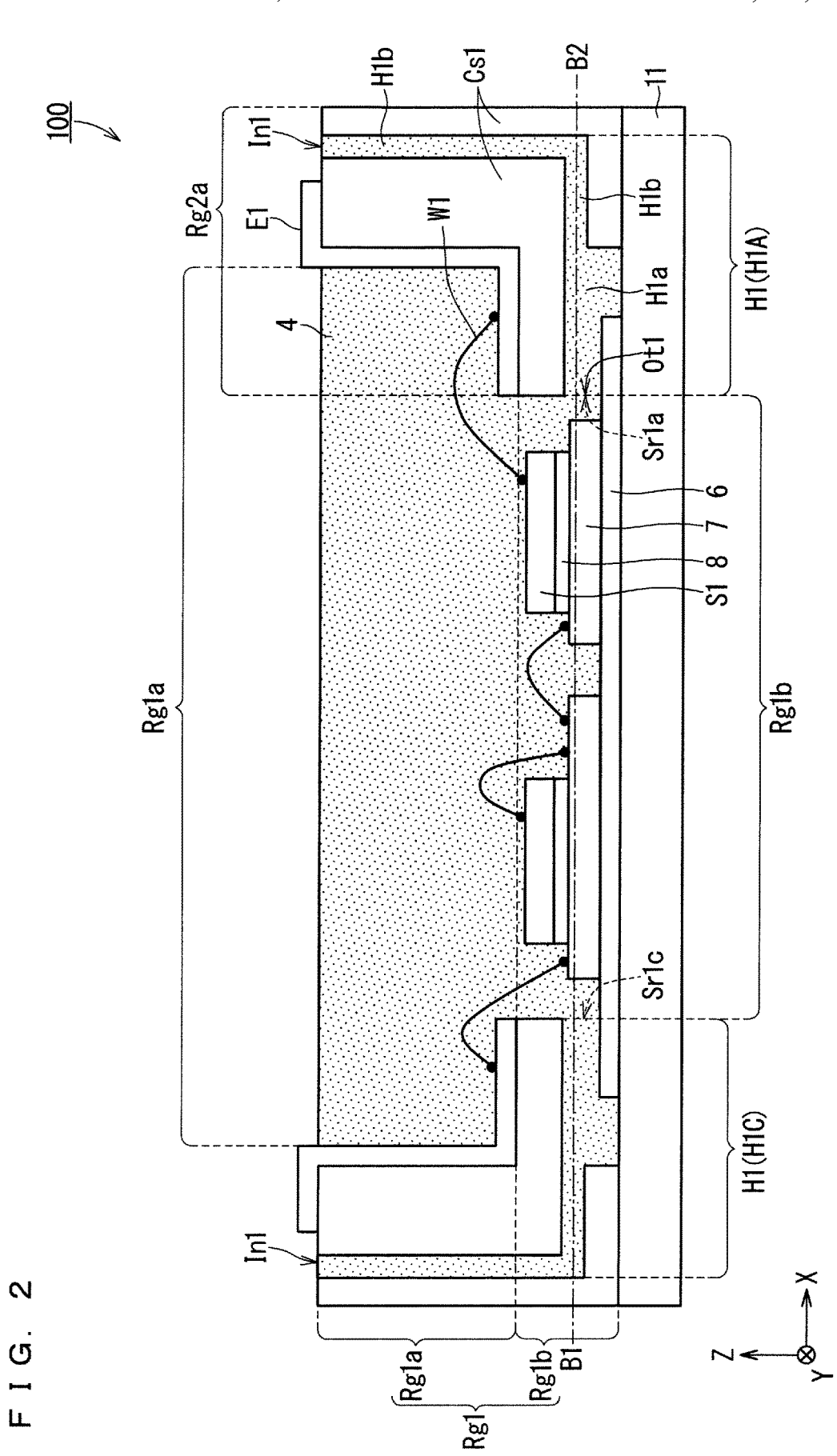
FIG. 2 is a cross-sectional view of the semiconductor device taken along line A1-A2 in FIG. 1.

FIG. 2 is a cross-sectional view of the semiconductor device 100 taken along line A1-A2 in FIG. 1. With reference to FIGS. 1 and 2, the semiconductor device 100 includes a substrate 6, a plurality of semiconductor elements S1, a base plate 11, a circuit pattern 7, a plurality of wires W1, and a case Cs1.

To the base plate 11, the substrate 6 is provided. The substrate 6 is, for example, an insulating substrate. At the surface of the substrate 6, the circuit pattern 7 is formed.

The semiconductor elements S1 are each, for example, a wide bandgap semiconductor. The wide bandgap semiconductor is composed of a material such as SiC or GaN, or diamond. That is, the band gap of the semiconductor elements S1 is fully great than the band gap of an Si semiconductor. The semiconductor elements S1 are each, for example, a power semiconductor element such as a metal-oxide-semiconductor field-effect transistor (MOSFET) or an insulated gate bipolar transistor (IGBT).

The semiconductor elements S1 of the present embodiment are each composed of, for example, SiC. Note that, the semiconductor elements S1 may be composed of Si. Each semiconductor element S1 has, for example, a plate-like (chip-like) shape.

Each semiconductor element S1 is bonded to the circuit pattern 7 via a bonding member 8. That is, the semiconductor elements S1 are fixed to the substrate 6 via the bonding member 8 and the circuit pattern 7. The bonding member 8 is made of, for example, solder, sintered Ag or the like.

Note that, while FIG. 1 shows four semiconductor elements S1, the number of the semiconductor elements S1 included in the semiconductor device 100 is not limited to four. The number of the semiconductor elements S1 included in the semiconductor device 100 may be one, two, three, or five or more.

To each semiconductor element S1, the wires W1 are connected. The wires W1 are made of, for example, metal. A terminal E1 is electrically connected to the semiconductor element S1 or the circuit pattern 7 via the wires W1. The wires W1 are connected to each semiconductor element S1.

The case Cs1 has, for example, a tubular shape. The case Cs1 as seen in a plan view (the XY plane) has a closed loop-like shape. The case Cs1 is insulating.

The case Cs1 is provided with the terminal E1. The case Cs1 is bonded to the base plate 11. The case Cs1 includes a region Rg1 as an opening. That is, the case Cs1 surrounds the region Rg1. The region Rg1 includes regions Rg1a, Rg1b. Therefore, the case Cs1 surrounds the region Rg1b. The region Rg1b (Rg1) is the region that contains the plurality of semiconductor elements S1 and the plurality of wires W1.

The shape of the region Rg1b as seen in a plan view (the XY plane) is a quadrangle that has four sides. The region Rg1b includes four side surfaces Sr1 corresponding to the four sides of that quadrangle, respectively. Hereinafter, the four side surfaces Sr1 are also referred to as side surfaces Sr1a, Sr1b, Sr1c, Sr1d, respectively.

Figure 3:
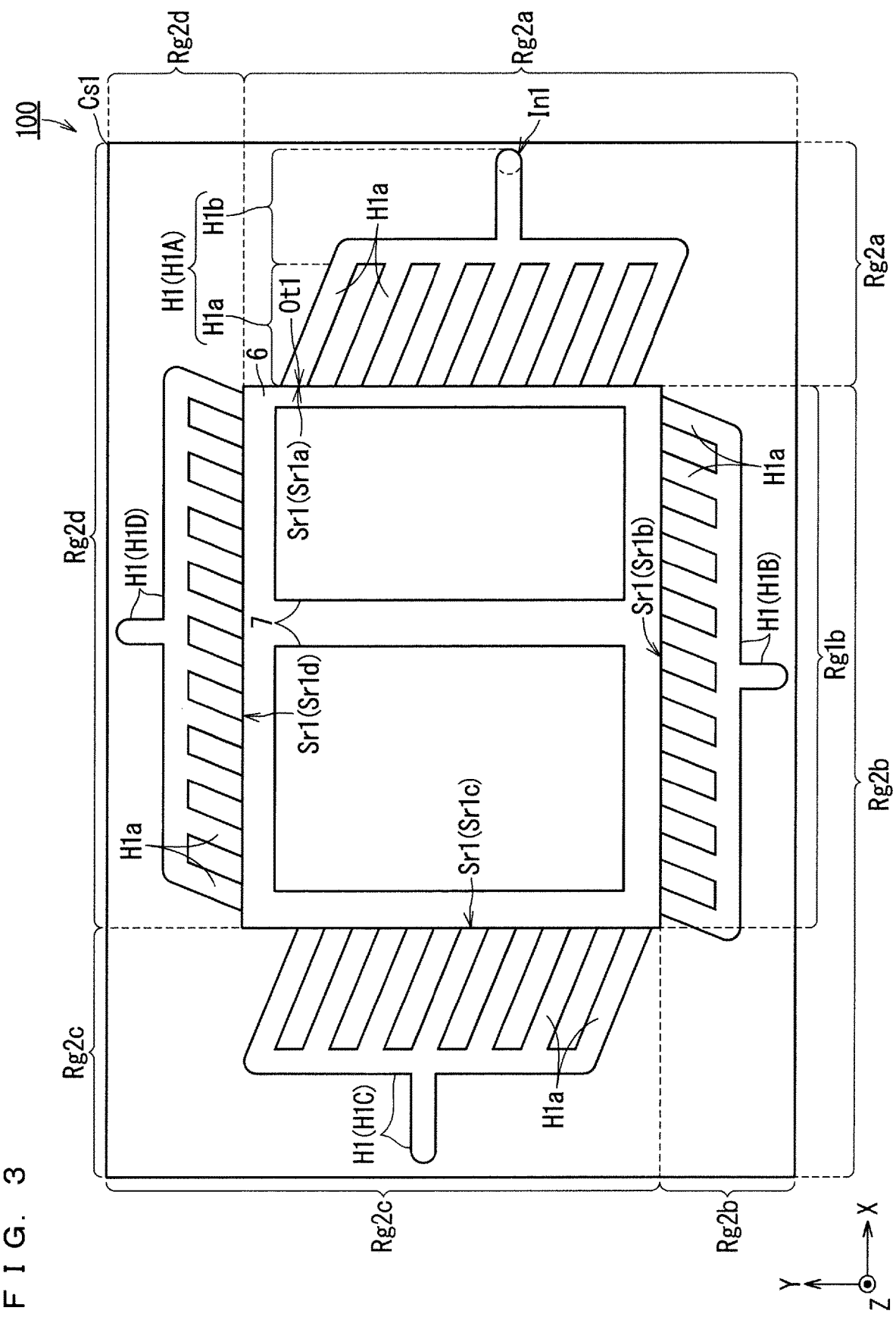
FIG. 3 is a cross-sectional view of the semiconductor device taken along line B1-B2 in FIG. 2.

FIG. 3 is a cross-sectional view of the semiconductor device 100 taken along line B1-B2 in FIG. 2. Note that, FIG. 3 shows the case Cs1 surrounding the region Rg1b.

With reference to FIGS. 2 and 3, the case Cs1 has straight parts Rg2a, Rg2b, Rg2c, Rg2d that surround the region Rg1b. The shape of each of the straight parts Rg2a, Rg2b, Rg2c, Rg2d is elongated. The straight parts Rg2a, Rg2b, Rg2c, Rg2d are respectively in contact with the side surfaces Sr1a, Sr1b, Sr1c, Sr1d.

Note that, the region Rg1 is filled with an encapsulation member 4. That is, the regions Rg1a, Rg1b are filled with the encapsulation member 4. Thus, the plurality of members (the semiconductor elements S1, the wires W1 and the like) contained by the region Rg1 (the regions Rg1a, Rg1b) are encapsulated with and protected by the encapsulation member 4. The encapsulation member 4 is thermosetting resin. The encapsulation member 4 is, for example, an epoxy resin.

Hereinafter, the state of the encapsulation member 4 in the situation where the encapsulation member 4 is flowable is also referred to as "liquid". Further, hereinafter, the state of the encapsulation member 4 in the situation where the encapsulation member 4 is not flowable is also referred to as "solid". The state of the encapsulation member 4 includes liquid and solid. By the liquid encapsulation member 4 being heated, the state of the encapsulation member 4 becomes solid.

(Characteristic Structure)

Next, a description will be given of the characteristic structure of the present embodiment (hereinafter also referred to as the "structure Ct1"). The structure Ct1 has the structure for allowing the encapsulation member to be injected into the region Rg1 (the regions Rg1a, Rg1b).

With reference to FIGS. 2 and 3, the case Cs1 is provided with k-pieces of through holes H1. "k" is an integer equal to or greater than two. In the present embodiment, as an example, "k" is four. That is, the case Cs1 is provided with four through holes H1. Each of the through holes H1 is provided with an injection port In1. The injection ports In1 are provided at the upper surface (the surface) of the case Cs1 (see FIGS. 1 and 2). The injection ports In1 are each an opening for injecting the liquid encapsulation member 4.

Hereinafter, the four through holes H1 are also referred to as through holes H1A, H1B, H1C, H1D, respectively. At the straight parts Rg2a, Rg2b, Rg2c, Rg2d of the case Cs1, the through holes H1A, H1B, H1C, H1D are provided, respectively.

The case Cs1 is provided with s-pieces of discharge paths H1a. "s" is an integer greater than k and equal to or greater than three. The s-pieces of discharge paths H1a are holes for discharging the liquid encapsulation member 4 to the region Rg1b. Each of the s-pieces of discharge paths H1a is provided with a discharge port Ot1 being in contact with the region Rg1b.

Next, a description will be given of the structure of the through hole H1A. The through hole H1A has a relay path H1b, and a plurality of discharge paths H1a. The plurality of discharge paths H1a correspond to part of the s-pieces of discharge paths H1a. That is, the plurality of discharge paths H1a are included in the s-pieces of discharge paths H1a. The relay path H1b is the path for guiding the liquid encapsulation member 4 injected into the injection port In1 to the plurality of discharge paths H1a. The relay path H1b is the hole connecting between the injection port In1 and the plurality of discharge paths H1a. Part of the relay path H1b is connected to the injection port In1. Other part of the relay path H1b is connected to the plurality of discharge paths H1a. Thus, the through holes H1A are branched so that one hole branches into a plurality of holes. Note that, each of the plurality of discharge paths H1a extends in the horizontal direction.

The through hole H1A has the above-described structure. Here, it is assumed that the liquid encapsulation member 4 is injected into the injection port In1 of the through hole H1A. In this case, the encapsulation member 4 is discharged to the region Rg1b via the relay path H1b and the plurality of discharge paths H1a.

Note that, the through holes H1B, H1C, H1D are similar in structure to the through hole H1A and thus, a detailed description of the through holes H1B, H1C, H1D is omitted.

Hereinafter, a narrow gap is also referred to as the "narrow gap part". At the region Rg1 (the regions Rg1a, Rg1b) and the through holes H1, a plurality of narrow gap parts exist. The narrow gap part is, for example, a gap below the wire W1. Further, the narrow gap part is, for example, a gap between the case Cs1 and the substrate 6.

Note that, the s-pieces of discharge paths H1a consist of a plurality of discharge paths H1a of the through hole H1A, a plurality of discharge paths H1a of the through hole H1B, a plurality of discharge paths H1a of the through hole H1C, and a plurality of discharge paths H1a of the through hole H1D.

In the structure Ct1, as seen in a plan view (the XY plane), the s-pieces of discharge paths H1a are provided so as to surround the region Rg1b. As seen in a plan view (the XY plane), the s-pieces of discharge paths H1a are spirally provided.

Hereinafter, in the four side surfaces Sr1, the side surface Sr1 with which the end of corresponding one of the plurality of discharge paths H1a included in each of the through holes H1 is in contact is also referred to as the "corresponding side surface".

For example, the end of each of the plurality of discharge paths H1a included in the through hole H1A is in contact with the side surface Sr1a as the corresponding side surface.

Specifically, as seen in a plan view (the XY plane), the plurality of discharge paths H1a are provided so that the end of each of the plurality of discharge paths H1a included in each of the through holes H1 and the corresponding side surface form an acute angle. That is, as seen in a plan view (the XY plane), each of the plurality of discharge paths H1a is inclined relative to the corresponding side surface. The angle of inclination of each of the plurality of discharge paths H1a relative to the corresponding side surface is uniform.

Note that, the angle of inclination of each of the plurality of discharge paths H1a relative to the corresponding side surface may not be uniform. In this case, the angle of inclination of each of the plurality of discharge paths H1a relative to the corresponding side surface falls within a range in which the later-described spiral formation is realized.

Hereinafter, the central part of the region Rg1b as seen in a plan view (the XY plane) is also referred to as the "central part Cb". Note that, the shape of each of the discharge paths H1a of each of the through holes H1 is not limited to straight. The shape of each of the discharge paths H1a of each of the through holes H1 may be arc-like so that the ends of the s-pieces of discharge paths H1a as seen in a plan view (the XY plane) are oriented toward the central part Cb.

Hereinafter, a method of manufacturing the semiconductor device 100 is also referred to as the "manufacturing method Pr". Next, a description will be given of the manufacturing method Pr. FIG. 4 is a flowchart of the manufacturing method Pr according to the first preferred embodiment. FIG. 4 shows just the main step included in the manufacturing method Pr.

Hereinafter, the state of the semiconductor device 100 in which the entire region Rg1 is filled with the encapsulation member 4 is also referred to as the "filled state". Further, hereinafter, the state of the semiconductor device 100 in which the region Rg1 is not filled with the encapsulation member 4 is also referred to as the "non-filled state". The non-filled state is the state of the semiconductor device 100 during the manufacture thereof.

In the manufacturing method Pr, an injection step (S110) is performed on the semiconductor device 100 in the non-filled state. In the injection step, an injection apparatus (not shown) having the function of injecting the liquid encapsulation member 4 using an injection nozzle is used.

Specifically, in the injection step, the injection apparatus injects the encapsulation member 4 into the injection port In1 of each of the through holes H1 so that the liquid encapsulation member 4 is discharged from the s-pieces of discharge paths H1a to the region Rg1b. The injection step is continuously performed until the entire region Rg1 (the regions Rg1a, Rg1b) is filled with the liquid encapsulation member 4.

Accordingly, for example, the liquid encapsulation member 4 injected into the injection port In1 of the through hole H1A is discharged to the region Rg1b via the relay path H1b, a plurality of discharge paths H1a, and a plurality of discharge ports Ot1. In each of the through holes H1B, H1C, H1D also, similarly to the through hole H1A, the liquid encapsulation member 4 is discharged to the region Rg1b from a plurality of discharge ports Ot1.

Figure 5:
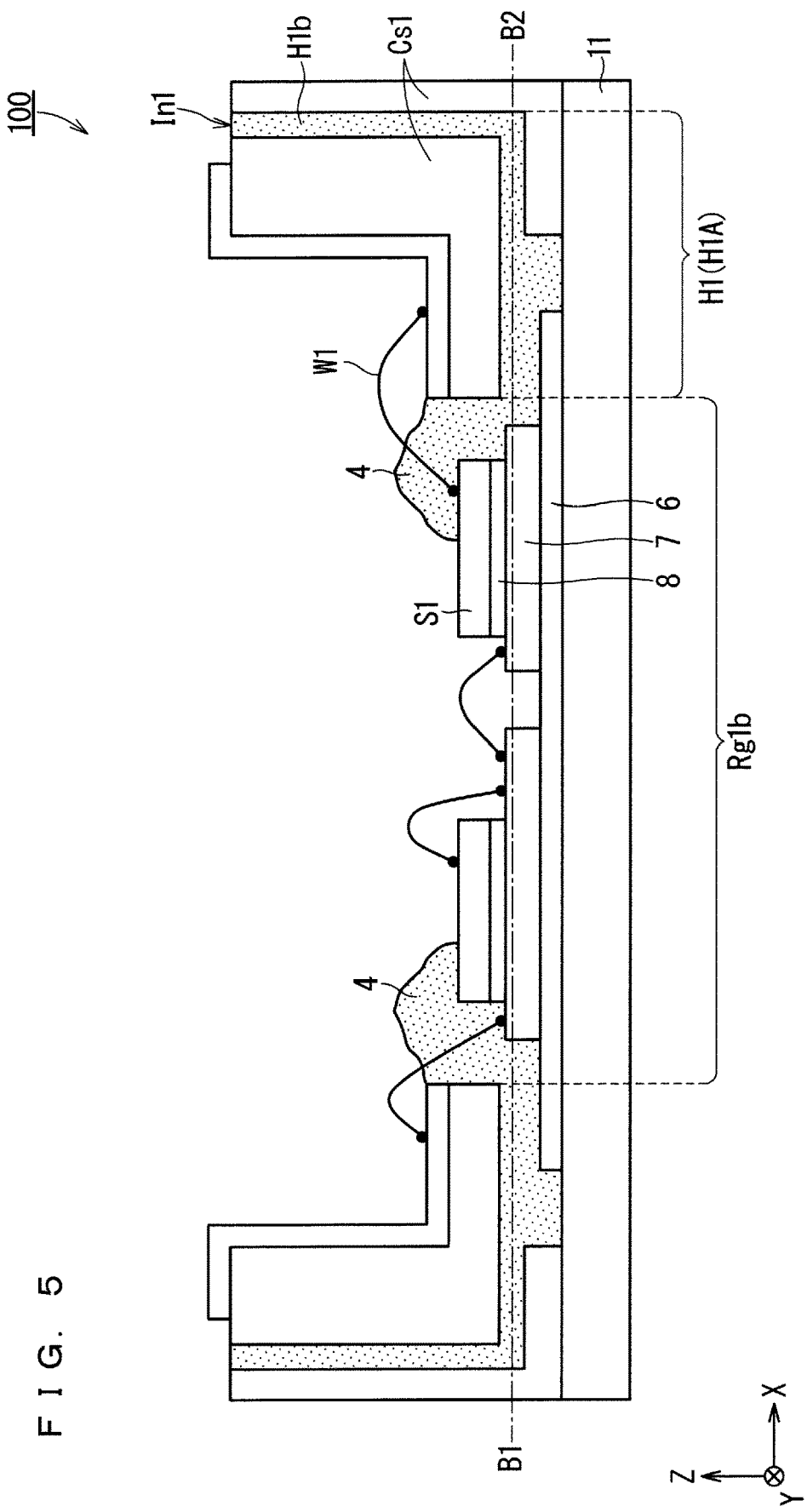
FIG. 5 shows the state of the semiconductor device immediately after start of an injection step.

Thus, immediately after the injection step is started, the encapsulation member 4 evenly flows over the entire rim part of the region Rg1b. The state of the semiconductor device 100 immediately after the injection step is started is, for example, the state shown in FIG. 5. Thereafter, the liquid encapsulation member 4 flows so as to form a spiral in the region Rg1 (the regions Rg1a, Rg1b). Note that, the liquid encapsulation member 4 flows so that the central part Cb corresponds to the center of the spiral.

Thus, for example, the above-described plurality of narrow gap parts in the region Rg1b is filled with the liquid encapsulation member 4. Thereafter, the height of the liquid encapsulation member 4 attains the height of the encapsulation member 4 shown in FIG. 2. Thereafter, by the liquid encapsulation member 4 being heated, the state of the encapsulation member 4 becomes solid. This ends the manufacturing method Pr, and the manufacture of the semiconductor device 100 completes.

(Effect)

As has been described above, according to the present embodiment, the semiconductor device 100 includes the case Cs1 that surrounds the region Rg1b containing the semiconductor elements S1 and the wires W1. The case Cs1 is provided with s(which is an integer greater than k and equal to or greater than three)-pieces of discharge paths H1a for discharging the encapsulation member 4 to the region Rg1b. The s-pieces of discharge paths H1a are provided so as to surround the region Rg1b as seen in a plan view. The s-pieces of discharge paths H1a are spirally provided as seen in a plan view.

Therefore, when the encapsulation member 4 is injected into the injection port In1 of each of the through holes H1 so that the encapsulation member 4 is discharged to the region Rg1b from the s-pieces of discharge paths H1a, any unevenness in the encapsulation member 4 discharged to the region Rg1b is suppressed. Accordingly, in the situation where the region containing the semiconductor elements and the wires is filled with the encapsulation member, generation of bubbles is suppressed.

Further, according to the present embodiment, the s-pieces of discharge paths H1a are provided so as to surround the region Rg1b as seen in a plan view. The s-pieces of discharge paths H1a are spirally provided as seen in a plan view. Therefore, when the injection step is performed, the liquid encapsulation member 4 flows so as to form a spiral in the region Rg1 (the regions Rg1a, Rg1b). Note that, the liquid encapsulation member 4 flows so that the central part Cb of the region Rg1b corresponds to the center of the spiral. That is, the flow direction of the liquid encapsulation member 4 is corrected.

Therefore, at the narrow gap part existing at the central part Cb of the region Rg1b also, a complicated flow of the encapsulation member 4 occurs. The complicated flow of the encapsulation member 4 is, for example, a flow of suppressing trapping air occurs by the uniform flow of the encapsulation member. Thus, the narrow gap part can be filled with the encapsulation member 4 without inviting generation of bubbles. Accordingly, the suppressed capsulation failure at the region Rg1b (the narrow gap part) is achieved. As a result, the effect of securing insulation of the semiconductor elements S1 and the wires W1 in the region Rg1b is attained.

Note that, in recent years, the structure of the semiconductor module (the semiconductor device) is increasingly complicated. Therefore, an encapsulation member exhibiting high viscosity is actively used in order to attain high resistance to voltage, high reliability, and low thermal resistance. The high viscosity is, for example, a viscosity of equal to or greater than 5000 mPa·s. Here, it is required to fill the narrow gap part at the central part Cb of the region Rg1b distanced from the discharge port with the high-viscosity encapsulation member without inviting generation of bubbles (capsulation-failed portions).

The semiconductor device 100 according to the present embodiment has the structure for exhibiting the above-described effect. Therefore, the semiconductor device 100 according to the present embodiment satisfies the above-described requirement.

Figure 6:
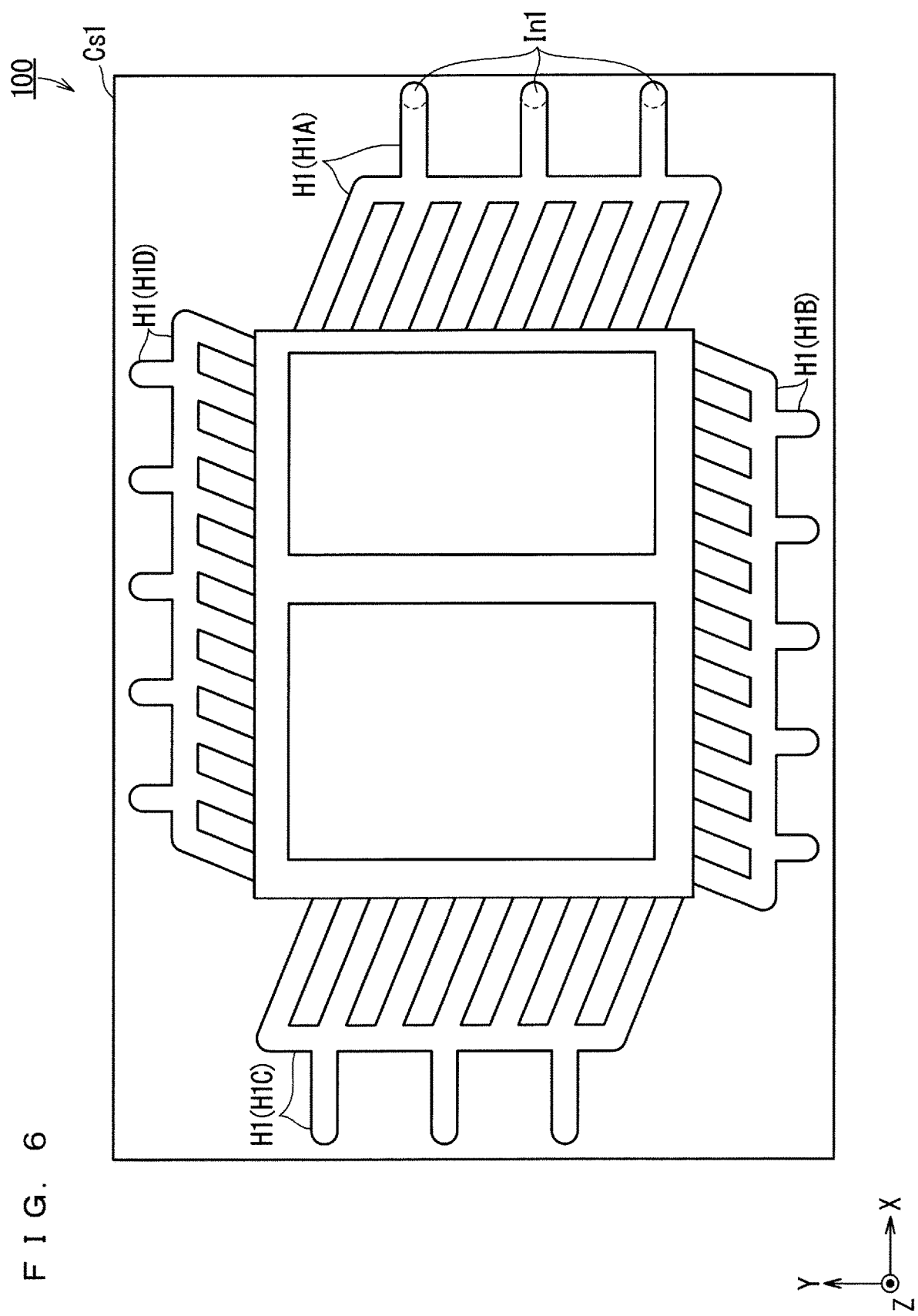
FIG. 6 shows the structure in which a plurality of injection ports are provided at through holes.

Note that, the number of the injection ports In1 provided at each of the through holes H1 is not limited to one. The number of the injection ports In1 provided at each of the through holes H1 may be plural as shown in FIG. 6. Further, a plurality of injection ports In1 may be provided at part of through holes H1 out of the four through holes H1, and one injection port In1 may be provided at other part of through hole(s) H1 out of the four through holes H1.

First Variation

As has been described above, the structure according to the first preferred embodiment is also referred to as the "structure Ct1". Further, hereinafter, the structure according to the present variation is also referred to as the "structure Ctm1". In the structure Ctm1, the plurality of discharge paths H1a included in the through holes H1 are different from one another in cross-sectional area. The structure Ctm1 is applied to the structure Ct1 (the first preferred embodiment).

Figure 7:
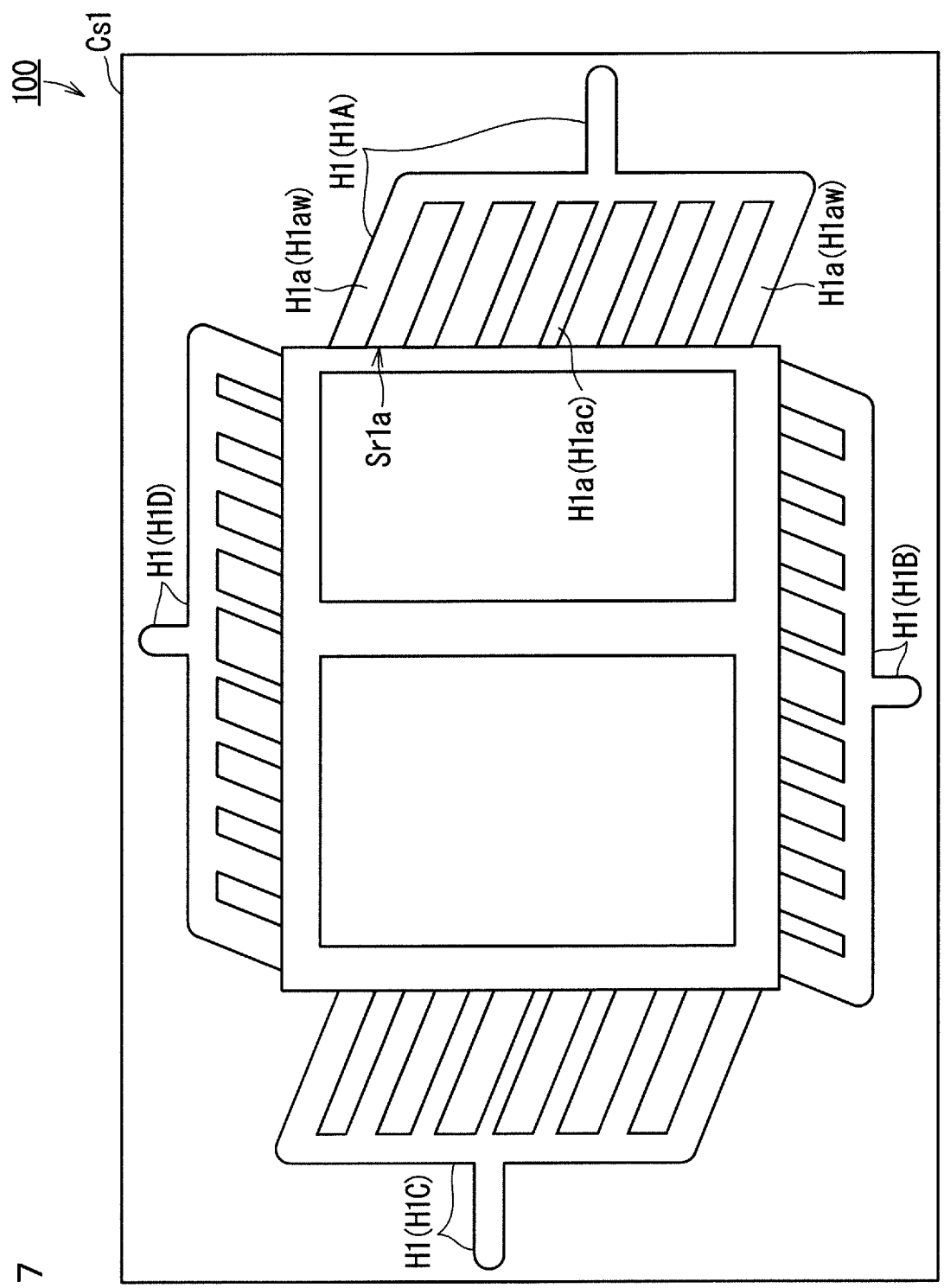
FIG. 7 is a cross-sectional view of a semiconductor device having the structure according to a first variation.

FIG. 7 is a cross-sectional view of the semiconductor device 100 having the structure Ctm1 according to a first variation. Hereinafter, the direction in the XY plane is also referred to as the "horizontal direction". Further, hereinafter, out of a plurality of discharge paths H1a included in each of the through holes H1, the discharge path nearest to an end of the corresponding side surface in the horizontal direction of that corresponding side surface is also referred to as the "discharge path H1aw". The discharge path H1aw is close to the corner of the region Rg1b . For example, out of a plurality of discharge paths H1a included in the through hole H1A, the discharge path H1a nearest to an end of the side surface Sr1a (the corresponding side surface) in the horizontal direction of that side surface Sr1a is the discharge path H1aw.

Further, hereinafter, out of a plurality of discharge paths H1a included in each of the through holes H1, the discharge path H1a nearest to the center of the corresponding side surface in the horizontal direction of that corresponding side surface is also referred to as the "discharge path H1ac". For example, out of a plurality of discharge paths H1a included in the through hole H1A, the discharge path H1a nearest to the center of the side surface Sr1a (the corresponding side surface) in the horizontal direction of that side surface Sr1a is the discharge path H1ac.

Next, a description will be given of the structure of the through hole H1A in the structure Ctm1. With reference to FIG. 7, the cross-sectional area of the discharge path H1aw is greater than the cross-sectional area of the discharge path H1ac. Specifically, out of a plurality of discharge paths H1a included in each of the through holes H1, the discharge path H1a nearer to the discharge path H1aw is greater in cross-sectional area.

Note that, the through holes H1B, H1C, H1D in the structure Ctm1 have the similar structure as the through hole H1A in the structure Ctm1.

(Effect)

As has been described above, the present variation suppresses variations in the amount of the liquid encapsulation member 4 discharged from each of a plurality of discharge paths H1a of each of the through holes H1 and in timing of injecting the liquid encapsulation member 4 to the region Rg1b in the injection step. Such variations occur due to, for example, the difference in length of the path from the injection port In1 to the discharge port Ot1 in each through hole H1. Further, such variations occur due to, for example, pressure loss in a plurality of paths of each through hole H1.

Therefore, the structure Ctm1 can equalize the amount of the liquid encapsulation member 4 discharged to the region Rg1b from a plurality of discharge paths H1a of each of the through holes H1. As a result, the liquid encapsulation member 4 is facilitated to flow so as to form a spiral in the region Rg1 (the regions Rg1a, Rg1b).

Second Variation

Hereinafter, the structure of the present variation is also referred to as the "structure Ctm2". In the structure Ctm2, a groove is provided at the substrate. The structure Ctm2 is applied to all or part of the structure Ct1 and the structure Ctm1.

As an example, the structure Ct1 to which the structure Ctm2 is applied (hereinafter also referred to as the "structure Ct1m2") is shown below. The structure Ct1m2 is obtained by applying the structure Ctm2 to the structure shown in FIG. 3. Hereinafter, at least one discharge path H1a included in the s-pieces of discharge paths H1a is also referred to as the "target discharge path". The target discharge path is the discharge path H1a with which the groove V1 is associated. Further, the target discharge path is the discharge path H1a which is the target of being provided with the groove V1 associated with the target discharge path.

Figure 8:
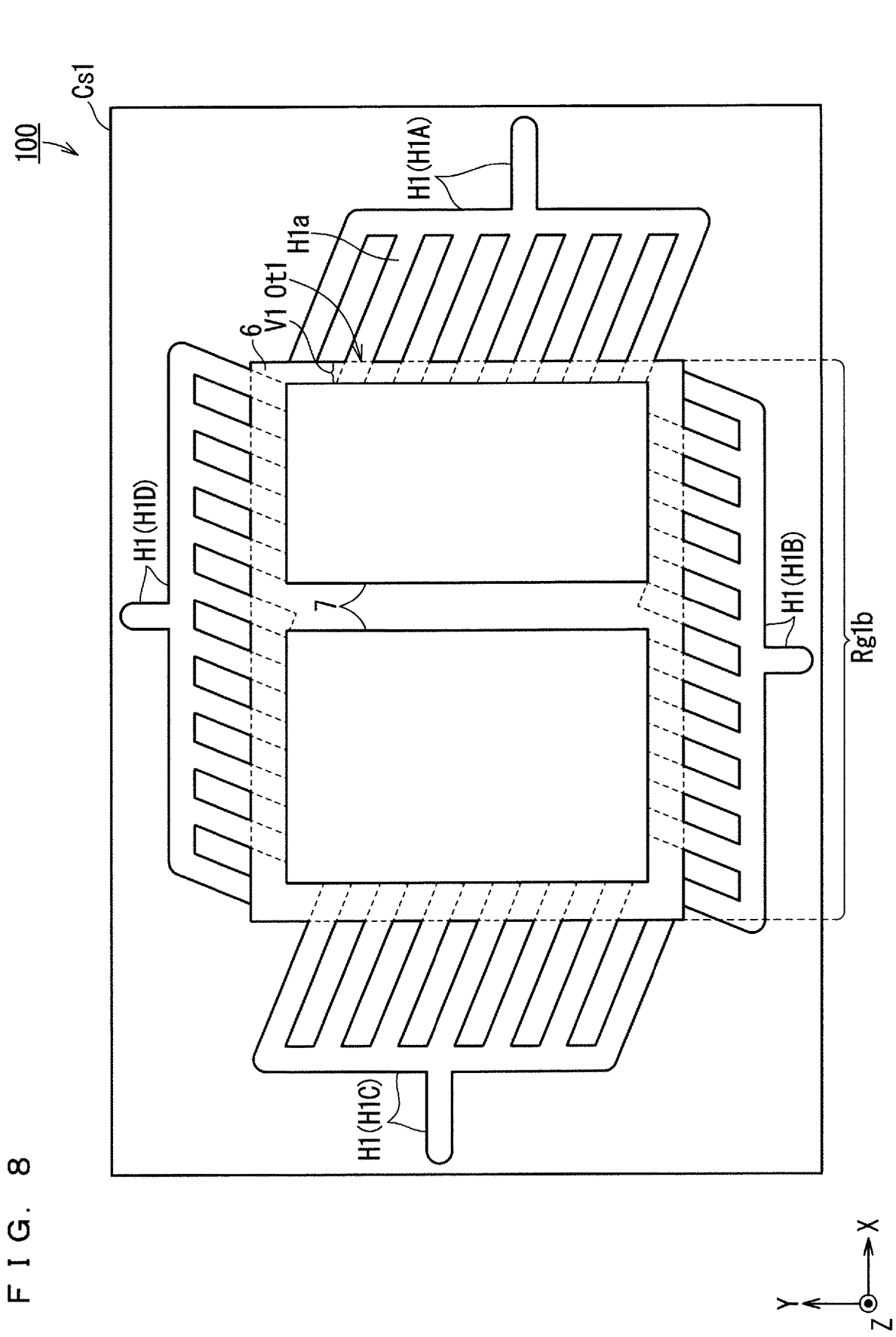
FIG. 8 is a cross-sectional view of a semiconductor device having the structure according to a second variation.

FIG. 8 is a cross-sectional view of the semiconductor device 100 having the structure Ct1m2 according to the second variation. With reference to FIG. 8, at the surface of the substrate 6, the groove V1 corresponding to the target discharge path (the discharge path H1a) is provided. The groove V1 exists in the direction to which the discharge port Ot1 of the target discharge path (the discharge path H1a) is oriented (hereinafter also referred to as the "discharge direction"). That is, the groove V1 exists on the extension of the target discharge path (the discharge path H1a).

Further, the shape of the groove V1 as seen in a plan view (the XY plane) is elongated. As seen in a plan view (the XY plane), the groove V1 extends in the discharge direction. As seen in a plan view (the XY plane), one end of the groove V1 is in contact with the discharge port Ot1 of the target discharge path (the discharge path H1a). Note that, as seen in a plan view (the XY plane), the other end of the groove V1 may not be in contact with the discharge port Ot1 of the target discharge path (the discharge path H1a).

The groove V1 is formed by engraving the surface of the substrate 6 in arc-shape. The groove V1 having the above-described structure is formed in association with a plurality of target discharge paths (the discharge paths H1a) corresponding to most of the s-pieces of discharge paths H1a. That is, at the surface of the substrate 6, a plurality of grooves V1 are provided. The plurality of grooves V1 are provided for suppressing concentration of stress, electric field and the like at the substrate 6.

(Effect)

As has been described above, the present variation corrects, by the grooves V1, the flow direction of the liquid encapsulation member 4 discharged to the region Rg1b in the injection step. Therefore, the flowing liquid encapsulation member 4 can easily reach the central part Cb. Further, stable spiral formation by the flow of the liquid encapsulation member 4 is realized.

Further, in the situation where the grooves V1 are filled with the encapsulation member 4, the anchoring effect improves adhesion between the encapsulation member 4 and the substrate 6. Further, the thermal cycle resistance improves. Therefore, the reliability of the semiconductor device 100 improves.

Note that, the shape of each groove V1 as seen in a plan view (the XY plane) is not limited to straight. Each groove V1 as seen in a plan view (the XY plane) may have an arc-like shape.

Third Variation

Hereinafter, the structure of the present variation is also referred to as the "structure Ctm3". In the structure Ctm3, a groove is provided at the circuit pattern. The structure Ctm3 is applied to all or part of the structure Ct1, the structure Ctm1, and the structure Ctm2. The target discharge path in the structure Ctm3 is the discharge path H1a with which a groove V2 is associated. Further, the target discharge path is the discharge path H1a which is the target of being provided with the groove V2 associated with the target discharge path.

As an example, the structure Ct1m2 to which the structure Ctm3 is applied (hereinafter also referred to as the "structure Ct1m23") is shown below. The structure Ct1m23 is obtained by applying the structure Ctm3 to the structure shown in FIG. 8.

Figure 9:
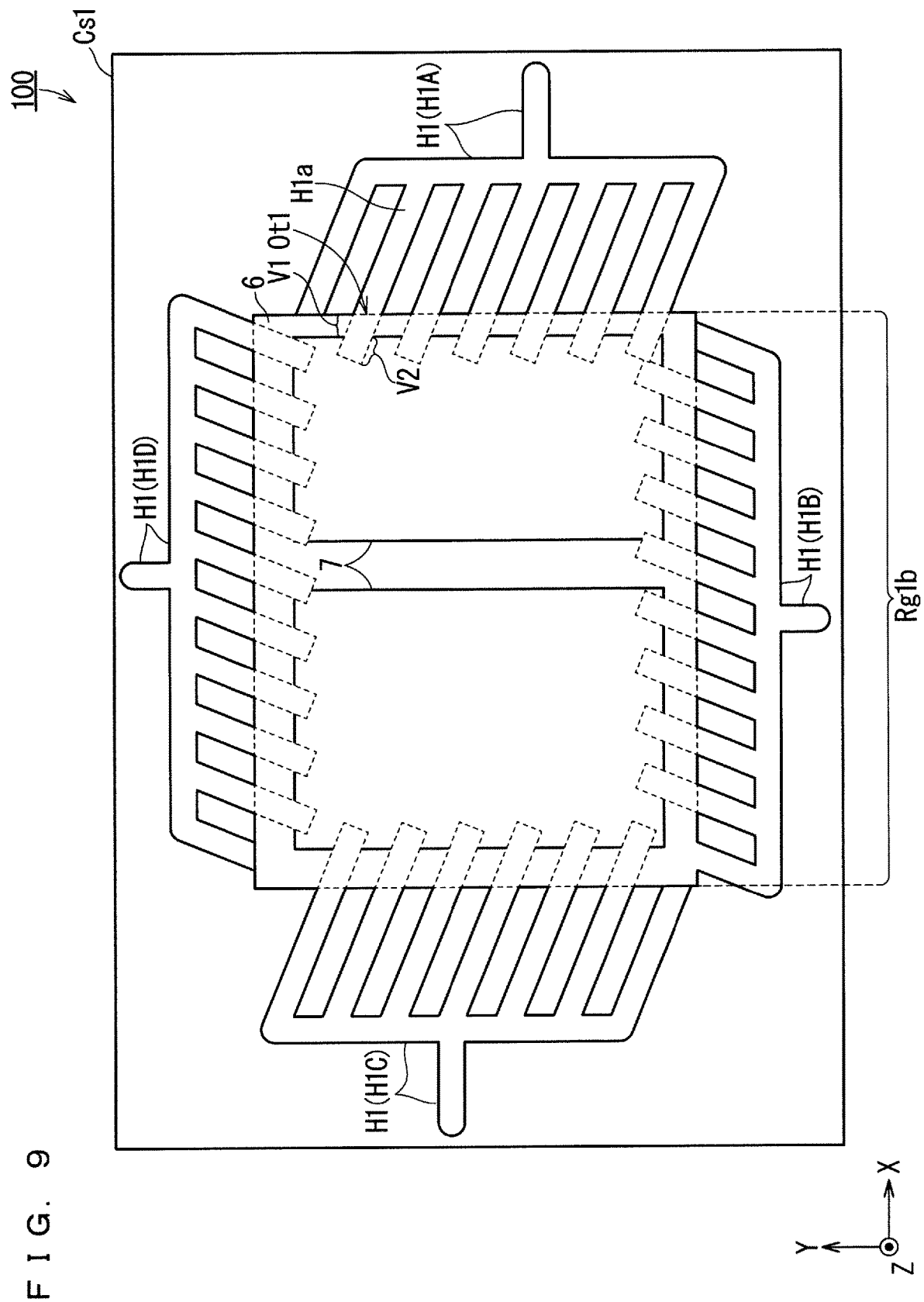
FIG. 9 is a cross-sectional view of a semiconductor device having the structure according to a third variation.

FIG. 9 is a cross-sectional view of the semiconductor device 100 having the structure Ct1m23 according to the third variation. With reference to FIG. 9, the circuit pattern 7 is provided with the groove V2 corresponding to the target discharge path (the discharge path H1a). The groove V2 exists in the direction to which the discharge port Ot1 of the target discharge path (the discharge path H1a) is oriented (the discharge direction). That is, the groove V2 exists on the extension of the target discharge path (the discharge path H1a). Further, as seen in a plan view (the XY plane), the groove V2 extends in the discharge direction.

Note that, the groove V2 is not provided at the semiconductor element region and the wire connection region. The semiconductor element region is, in the circuit pattern 7, the region where each semiconductor element S1 is bonded. The wire connection region is, in the circuit pattern 7, the region where each wire W1 is connected.

As has been described above, as seen in a plan view (the XY plane), one end of the groove V1 is in contact with the discharge port Ot1 of the target discharge path (the discharge path H1a).

In the structure Ct1m23, as seen in a plan view (the XY plane), the other end of the groove V1 is in contact with the groove V2. That is, the groove V2 is connected to the groove V1.

The groove V2 having the above-described structure is connected to each of the plurality of grooves V1. That is, the circuit pattern 7 is provided with a plurality of grooves V2.

(Effect)

As has been described above, the present variation further corrects, by the grooves V2, the flow direction of the liquid encapsulation member 4 corrected by the grooves V1. Therefore, the flowing encapsulation member 4 can further easily reach the central part Cb. Further, stable spiral formation by the flow of the liquid encapsulation member 4 is realized.

Further, in the situation where the grooves V2 are filled with the encapsulation member 4, the anchoring effect improves adhesion between the encapsulation member 4 and the circuit pattern 7. Further, the thermal cycle resistance improves. Therefore, the reliability of the semiconductor device 100 improves.

Further, in the structure Ct1m23, in the situation where the grooves V1, V2 are filled with the encapsulation member 4, the anchoring effect improves adhesion between the encapsulation member 4 and the substrate 6, and adhesion between the encapsulation member 4 and the circuit pattern 7.

Note that, the shape of each groove V2 as seen in a plan view (the XY plane) is not limited to straight. Each groove V2 as seen in a plan view (the XY plane) may have an arc-like shape.

Further, while FIG. 9 shows the structure in which both the grooves V1, V2 exist in the semiconductor device 100, the present invention is not limited to this structure. In the structure Ctm3, no grooves V1 may be formed at the substrate 6, and the grooves V2 may be formed at the circuit pattern 7. This structure corresponds to the structure obtained by removing the plurality of grooves V1 from the structure shown in FIG. 9.

Fourth Variation

Hereinafter, the structure of the present variation is also referred to as the "structure Ctm4". In the structure Ctm4, a tapered surface is provided at the injection port. The structure Ctm4 is applied to all or part of the structure Ct1, the structure Ctm1, the structure Ctm2, and the structure Ctm3.

Figure 10:
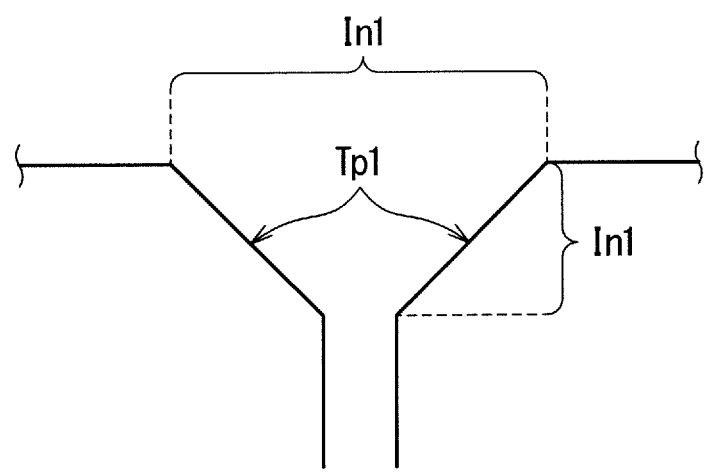
FIG. 10 is a cross-sectional view of an injection port having the structure according to a fourth variation.

FIG. 10 is a cross-sectional view of the injection port In1 having the structure Ctm4 according to the fourth variation. With reference to FIG. 10, the injection port In1 is provided with a tapered surface Tp1 (the inclined surface). Specifically, the tapered surface Tp1 is provided to the injection port In1 so that the shape of the injection port In1 becomes inverted cone-shaped (funnel-shaped). All the injection ports In1 in the case Cs1 have the structure shown in FIG. 10. Note that, out of all the injection ports In1, just part of the injection ports In1 may have the structure shown in FIG. 10.

(Effect)

As has been described above, in the present variation, the tapered surface Tp1 (the inclined surface) is provided to the injection port In1. Thus, the speed of injecting the liquid encapsulation member 4 in the injection step improves. Therefore, the reduced manufacturing time of the semiconductor device 100 is achieved.

Note that, the tapered surface Tp1 is desirably structured so that the shape of the injection port In1 is similar to that of the tip part of the injection nozzle of the injection apparatus. Thus, the contact area between the injection port In1 and the injection nozzle increases. Accordingly, in performing the injection step, the risk of the liquid encapsulation member 4 flowing over the injection port In1 due to the internal pressure in the through holes H1 reduces.

Fifth Variation

Hereinafter, the structure of the present variation is also referred to as the "structure Ctm5". In the structure Ctm5, a plurality of discharge ports are provided in the vertical direction. The structure Ctm5 is applied to all or part of the structure Ct1, the structure Ctm1, the structure Ctm2, the structure Ctm3, and the structure Ctm4.

As an example, the structure Ct1 to which the structure Ctm5 (hereinafter also referred to as the "structure Ct1$m$5") is applied is shown below. The structure Ct1$m$5 is obtained by applying the structure Ctm5 to the structure shown in FIG. 2.

Figure 11:
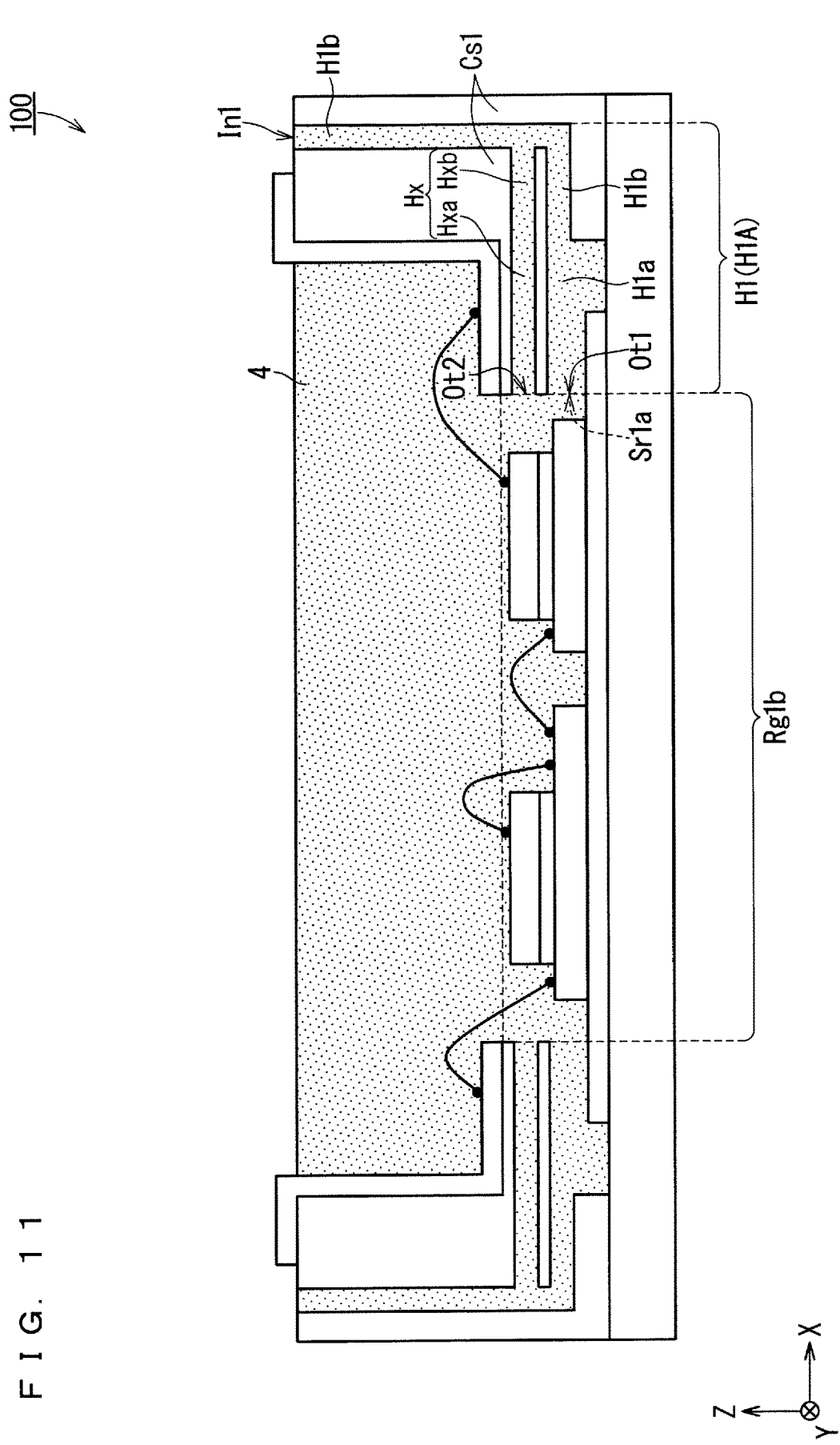
FIG. 11 is a cross-sectional view of a semiconductor device having the structure according to a fifth variation.

FIG. 11 is a cross-sectional view of the semiconductor device 100 having the structure Ct1$m$5 according to the fifth variation. Next, a description will be given of the structure of the through hole H1A in the structure Ct1$m$5. With reference to FIG. 11, at the through hole H1A, the discharge port Ot1 and a discharge port Ot2 are provided. The discharge port Ot2 is an opening for discharging the liquid encapsulation member 4 to the region Rg1$b$. The discharge port Ot2 is in contact with the region Rg1$b$. Further, the through hole H1A has a path Hx.

The discharge port Ot2 is connected to the central part of the relay path H1$b$ via the path Hx. The central part of the relay path H1$b$ corresponds to, for example, the right end of the through hole H1A shown in FIG. 11.

The path Hx is structured by a discharge path Hxa and a relay path Hxb. The discharge path Hxa is a hole for discharging the liquid encapsulation member 4 to the region Rg1$b$. The number of the discharge paths Hxa and the shape thereof are identical to the number and shape of the discharge path H1$a$ according to the first preferred embodiment. For example, the number and shape of the discharge path Hxa are the number and shape of the discharge path H1$a$ shown in FIG. 3. That is, at the through hole H1A, a plurality of discharge paths Hxa are provided. Note that, at the end of each of the plurality of discharge paths Hxa, the discharge port Ot2 is provided.

The relay path Hxb has the shape and function similar to those of the relay path H1$b$ according to the first preferred embodiment. For example, the shape of the relay path Hxb is similar to that of the relay path H1$b$ shown in FIG. 3.

The relay path Hxb is the hole connecting between the central part of the relay path H1$b$ and a plurality of discharge paths Hxa. Part of the relay path Hxb is connected to the central part of the relay path H1$b$. Other part of the relay path Hxb is connected to the plurality of discharge paths Hxa.

Further, the path Hx is provided above the discharge path H1$a$. That is, the discharge port Ot2 is provided above the discharge port Ot1. That is, in the structure Ct1$m$5, at the through hole H1A, a plurality of types of discharge ports (the discharge ports Ot1, Ot2) at different heights are provided.

Note that, the number of the discharge ports at different heights at the through hole H1A is not limited to two, and may be three or more.

The through hole H1A in the structure Ct1$m$5 has the above-described structure. Here, it is assumed that the liquid encapsulation member 4 is injected into the injection port In1 of the through hole H1A. In this case, the encapsulation member 4 is discharged to the region Rg1$b$ via the relay path H1$b$ and a plurality of discharge paths H1$a$. Further, the liquid encapsulation member 4 is discharged to the region Rg1$b$ via a plurality of discharge paths Hxa (the discharge ports Ot2).

Note that, the through holes H1B, H1C, H1D in the structure Ct1$m$5 also have the structure similar to that of the through hole H1A in the structure Ct1$m$5.

(Effect)

As has been described above, the present variation improves the speed of injecting the liquid encapsulation member 4 in the injection step. Therefore, the reduced manufacturing time of the semiconductor device 100 is achieved.

In the structure Ct1$m$5, while the discharge port Ot2 is provided at each of the through holes H1A, H1B, H1C, H1D, the present invention is not limited thereto. The discharge port Ot2 (the path Hx) may be provided at just part of the through holes H1A, H1B, H1C, H1D (for example, just the through holes H1A, H1C).

Second Preferred Embodiment

Hereinafter, the semiconductor device 100 according to any of the first preferred embodiment, the first variation, the second variation, the third variation, the fourth variation, and the fifth variation is also referred to as the "semiconductor device Dv1". The structure of the present embodiment is obtained by applying the semiconductor device Dv1 to a power conversion apparatus (hereinafter also referred to as the "structure Ct2"). Hereinafter, the power conversion apparatus in the structure Ct2 is also referred to as the "power conversion apparatus 800". The power conversion apparatus 800 is an apparatus in which the semiconductor device Dv1 is used.

The power conversion apparatus 800 is, as an example, a three-phase inverter. Hereinafter, the power conversion system to which the power conversion apparatus 800 is applied is also referred to as the "power conversion system SY1".

Figure 12:
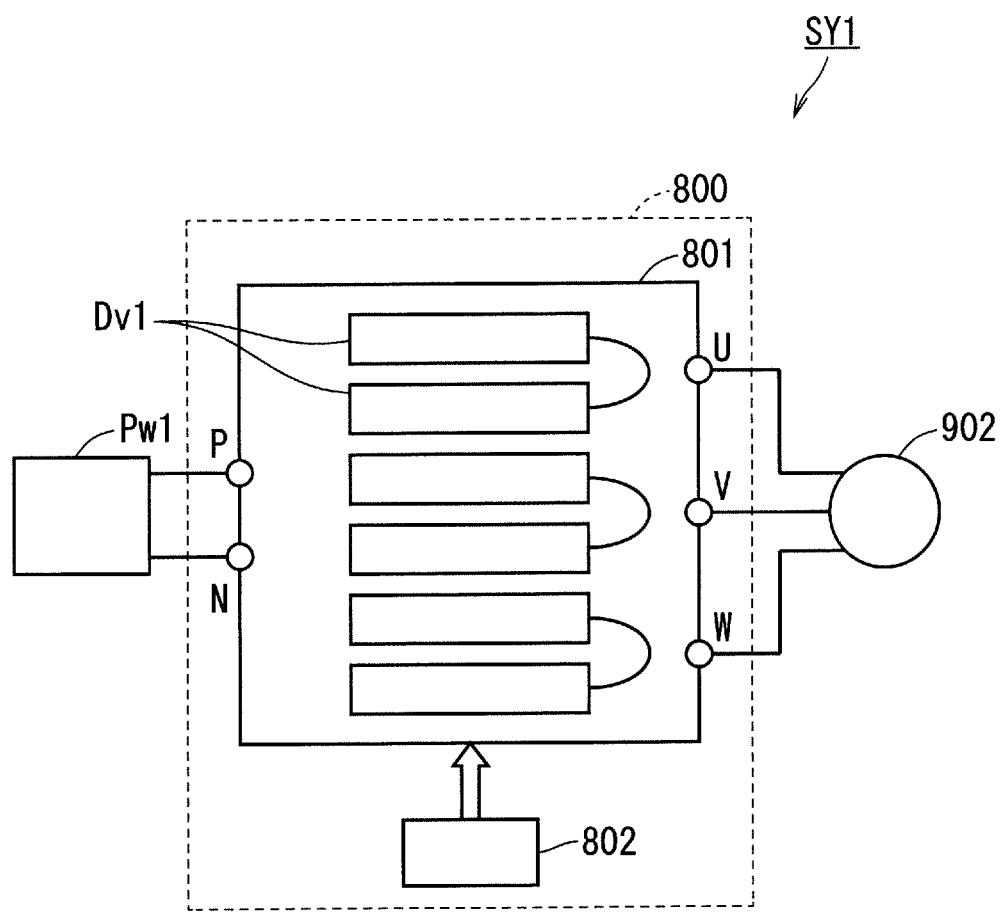
FIG. 12 is a block diagram showing the structure of a power conversion system according to a second preferred embodiment.

FIG. 12 is a block diagram showing the structure of the power conversion system SY1 according to the second preferred embodiment. With reference to FIG. 12, the power conversion system SY1 includes a power supply Pw1, the power conversion apparatus 800, and a load 902.

The power supply Pw1 is, for example, a DC power supply. The power supply Pw1 supplies DC power to the power conversion apparatus 800. The power supply Pw1 is structured by any of various elements. The power supply Pw1 is, for example, a battery connected to the DC system. Further, the power supply Pw1 may be, for example, a solar battery, a storage battery or the like.

Note that, the power supply Pw1 may be a power supply connected to an AC system. In this case, the power supply Pw1 is structured by a rectifier circuit and an AC/DC converter. Further, the power supply Pw1 may be structured by a DC/DC converter that converts DC power output from a DC system into predetermined power.

The power conversion apparatus 800 is, for example, a two-level power conversion apparatus. The power conversion apparatus 800 is provided between the power supply Pw1 and the load 902. The power conversion apparatus 800 is electrically connected to the power supply Pw1 and the load 902. The power conversion apparatus 800 has the function of converting DC power into AC power, and outputting the AC power.

As shown in FIG. 12, the power conversion apparatus 800 includes a power conversion circuit 801 and a control circuit 802. The power conversion circuit 801 has the function of converting the received power, and outputting the converted power. Specifically, the power conversion circuit 801 has the function of converting DC power into AC power, and outputting the AC power.

The control circuit 802 outputs a control signal for controlling the power conversion circuit 801 to the power conversion circuit 801. For example, the control circuit 802 outputs, to the power conversion circuit 801, a control signal for controlling the switching operation of the power conversion circuit 801. The power conversion circuit 801 converts, based on the control signal, DC power supplied from the power supply Pw1 into AC power. Then, the power conversion circuit 801 supplies the AC power to the load 902.

The power conversion circuit 801 is, for example, a two-level three-phase full bridge circuit. The power conversion circuit 801 includes two series-connected semiconductor devices Dv1 each corresponding to the U-phase, the V-phase, and the W-phase. That is, the power conversion circuit 801 includes six semiconductor devices Dv1.

The load 902 is a three-phase motor driven by the AC power supplied from the power conversion apparatus 800. Note that, the load 902 is not limited to of specific use, and is a motor mounted on any of various kinds of electric devices. The load 902 may be, for example, a motor used in a hybrid vehicle, an electric vehicle or the like. Further, the load 902 may be, for example, a motor used in a railroad car. Further, the load 902 may be, for example, a motor used in an elevator, an air conditioner or the like.

(Effect)

As has been described above, the power conversion apparatus 800 includes the power conversion circuit 801 and the control circuit 802. The power conversion circuit 801 includes the semiconductor devices Dv1. The semiconductor devices Dv1 are each the semiconductor device 100 according to any of the first preferred embodiment, the first variation, the second variation, the third variation, the fourth variation, and the fifth variation.

Therefore, the semiconductor devices Dv1 are highly reliable in its attaining suppressed generation of bubbles in the situation where the region containing the semiconductor elements and the wires is filled with the encapsulation member. Accordingly, the power conversion apparatus 800 including the semiconductor devices Dv1 is capable of stably converting power.

Note that, in the present embodiment, while an exemplary case in which the semiconductor devices Dv1 are applied to a two-level power conversion apparatus (the three-phase inverter) has been described, the present invention is not limited thereto and the semiconductor device Dv1 can be applied to any of various kinds of power conversion apparatuses.

Further, the power conversion apparatus 800 according to the present embodiment is not limited to a two-level power conversion apparatus. The power conversion apparatus 800 may be a three-level power conversion apparatus. Further, the power conversion apparatus 800 may be a multi-level power conversion apparatus. In the case where power is to be supplied to a single-phase load, the semiconductor device Dv1 may be applied to a single-phase inverter. Further, in the case where power is to be supplied to a DC load or the like, the semiconductor device Dv1 can be applied to a DC/DC converter, an AC/DC converter or the like.

Further, the power conversion apparatus to which the semiconductor device Dv1 is applied is not limited to the structure in which the above-described load 902 is a motor. The power conversion apparatus to which the semiconductor device Dv1 is applied may be, for example, a power supply apparatus such as an electrical discharge machine or a laser work machine. Further, the power conversion apparatus to which the semiconductor device Dv1 is applied may be a power supply apparatus of an induction cooker, a contactless power supply system or the like. Further, the power conversion apparatus to which the semiconductor device Dv1 is applied may be a power conditioner such as a solar photovoltaic power generation system or a power storage system.

Note that, within the scope of the present invention, the embodiments and the variations can be freely combined, modified, or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device having a region filled with an encapsulation member, the semiconductor device comprising:
   a substrate;
   a semiconductor element fixed to the substrate;
   a wire connected to the semiconductor element; and
   a case surrounding the region that contains the semiconductor element and the wire, wherein
   the case is provided with k(an integer equal to or greater than two)-pieces of through holes,
   each of the through holes is provided with an injection port for injecting the encapsulation member,
   the case is provided with s(an integer greater than k and equal to or greater than three)-pieces of discharge paths for discharging the encapsulation member to the region,
   each of the through holes has a plurality of discharge paths included in the s-pieces of discharge paths,
   the s-pieces of discharge paths are provided so as to surround the region as seen in a plan view, and
   the s-pieces of discharge paths are spirally provided as seen in a plan view.

2. The semiconductor device according to claim 1, wherein
k is four,
a shape of the region as seen in a plan view is a quadrangle having four sides,
the region includes four side surfaces corresponding to the four sides, respectively,
the case has four straight parts that surround the region,
the four straight parts are in contact with the four side surfaces, respectively, and
the four straight parts are provided with four through holes, respectively.

3. The semiconductor device according to claim 2, wherein
an end of each of the plurality of discharge paths included in each of the through holes is in contact with a corresponding side surface being one side surface included in the four side surfaces, and
the plurality of discharge paths are provided so that the end of each of the plurality of discharge paths and the corresponding side surface form an acute angle as seen in a plan view.

4. The semiconductor device according to claim 2, wherein
an end of each of the plurality of discharge paths included in each of the through holes is in contact with a corresponding side surface being one side surface included in the four side surfaces,
the plurality of discharge paths include a first discharge path and a second discharge path,
the first discharge path is, out of the plurality of discharge paths, a discharge path nearest to an end of the corresponding side surface in a horizontal direction of the corresponding side surface,
the second discharge path is, out of the plurality of discharge paths, a discharge path nearest to a center of the corresponding side surface in the horizontal direction of the corresponding side surface, and
a cross-sectional area of the first discharge path is greater than a cross-sectional area of the second discharge path.

5. The semiconductor device according to claim 1, wherein
each of the s-pieces of discharge paths is provided with a discharge port being in contact with the region,
at a surface of the substrate, a first groove corresponding to a target discharge path being at least one discharge path included in the s-pieces of discharge paths is provided, and
the first groove exists in a direction to which the discharge port of the target discharge path is oriented.

6. The semiconductor device according to claim 5, wherein
a circuit pattern is formed at the surface of the substrate,
the circuit pattern is provided with a second groove corresponding to the target discharge path, and
the second groove exists in the direction to which the discharge port of the target discharge path is oriented.

7. The semiconductor device according to claim 6, wherein
a shape of the first groove as seen in a plan view is elongated,
as seen in a plan view, one end of the first groove is in contact with the discharge port of the target discharge path, and
as seen in a plan view, the other end of the first groove is in contact with the second groove.

8. The semiconductor device according to claim 1, wherein
each of the s-pieces of discharge paths is provided with a discharge port being in contact with the region,
a circuit pattern is formed at a surface of the substrate,
the circuit pattern is provided with a second groove corresponding to a target discharge path being at least one discharge path included in the s-pieces of discharge paths, and
the second groove exists in a direction to which the discharge port of the target discharge path is oriented.

9. The semiconductor device according to claim 1, wherein the injection port is provided with a tapered surface.

10. The semiconductor device according to claim 1, wherein
each of the s-pieces of discharge paths is provided with a discharge port being in contact with the region,
at least one the through hole included in the k-pieces of through holes is provided with
a first discharge port being the discharge port, and
a second discharge port for discharging the encapsulation member to the region,
the second discharge port is in contact with the region, and
the second discharge port is provided above the first discharge port.

11. A power conversion apparatus using the semiconductor device according to claim 1, comprising:
a power conversion circuit including the semiconductor device, the power conversion circuit converting power to be received and outputting the converted power; and
a control circuit outputting a control signal for controlling the power conversion circuit to the power conversion circuit.

* * * * *